(12) United States Patent
Tsuruoka et al.

(10) Patent No.: US 12,359,059 B2
(45) Date of Patent: Jul. 15, 2025

(54) BIAXIALLY STRETCHED FILM, FILM WITH CURED RESIN LAYER, AND METAL LAMINATED FILM

(71) Applicant: Mitsubishi Chemical Corporation, Tokyo (JP)

(72) Inventors: Taiki Tsuruoka, Nagahama (JP); Shunsuke Koido, Nagahama (JP); Tomohiro Suzuki, Nagahama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 18/387,208

(22) Filed: Nov. 6, 2023

(65) Prior Publication Data

US 2024/0076489 A1    Mar. 7, 2024

Related U.S. Application Data

(63) Continuation of application No. PCT/JP2022/017588, filed on Apr. 12, 2022.

(30) Foreign Application Priority Data

| May 6, 2021 | (JP) | 2021-078732 |
| May 14, 2021 | (JP) | 2021-082771 |
| Mar. 17, 2022 | (JP) | 2022-043076 |

(51) Int. Cl.
| C08L 67/02 | (2006.01) |
| B29L 31/34 | (2006.01) |
| C08J 5/18 | (2006.01) |
| H05K 1/03 | (2006.01) |
| B29C 55/14 | (2006.01) |
| B29K 67/00 | (2006.01) |

(52) U.S. Cl.
CPC .......... *C08L 67/02* (2013.01); *C08J 5/18* (2013.01); *H05K 1/0353* (2013.01); *B29C 55/14* (2013.01); *B29K 2067/00* (2013.01); *B29K 2995/0053* (2013.01); *B29L 2031/3425* (2013.01); *C08J 2367/02* (2013.01); *C08J 2467/02* (2013.01); *C08L 2203/16* (2013.01); *C08L 2203/20* (2013.01); *C08L 2205/025* (2013.01); *H05K 2201/10098* (2013.01)

(58) Field of Classification Search
None
See application file for complete search history.

(56) References Cited

FOREIGN PATENT DOCUMENTS

| CN | 107634328 A | | 1/2018 |
| CN | 115087218 A | * | 9/2022 |
| JP | S50-024366 A | | 3/1975 |
| JP | H06-107929 A | | 4/1994 |
| JP | 2000-017159 A | | 1/2000 |
| JP | 2001-234048 A | | 8/2001 |
| JP | 2005-023107 A | | 1/2005 |
| JP | 2006-352470 A | | 12/2006 |
| JP | 2007-287312 A | | 11/2007 |
| JP | 2011-066692 A | | 3/2011 |
| JP | 2018-090687 A | | 6/2018 |
| JP | 2021-038281 A | | 3/2021 |
| JP | 2021-070823 A | | 5/2021 |
| JP | 2021-161151 A | | 10/2021 |

OTHER PUBLICATIONS

CN 115087218A Machine Translation via EPO (Year: 2021).*
JP 2001234048A Machine Translation via EPO (Year: 2001).*
JP 2018090687A Machine Translation via EPO (Year: 2018).*
Development trends of high-speed, high-frequency compatible FPC and low transmission loss, Chap. 3, Sec. 2, pp. 77-84, Development trends of high frequency compatible components and applications to 5G and millimeter wave radar (2019) (see non-patent literature 1 of present specification).
International Search Report issued in corresponding International Patent Application No. PCT/JP2022/017588 dated Jul. 19, 2022.
Development trends of high-speed, high-frequency compatible FPC and low transmission loss, Chap. 3, Sec. 2, pp. 77-84, Development trends of high frequency compatible components and applications to 5G and millimeter wave radar (2019) (English translation of previously submitted document).
Extended European Search Report issued in corresponding European Patent Application No. 22798872.2, dated Oct. 9, 2024.

* cited by examiner

*Primary Examiner* — Laura C Powers
(74) *Attorney, Agent, or Firm* — Morgan, Lewis & Bockius LLP

(57) ABSTRACT

Disclosed is a biaxially stretched film containing two or more kinds of polyesters, in which at least one of the polyesters is a polybutylene naphthalate resin (A), and a dielectric tangent at 28 GHz is 0.0040 or less. There can be provided a biaxially stretched film having excellent low-dielectric properties.

19 Claims, No Drawings

BIAXIALLY STRETCHED FILM, FILM WITH CURED RESIN LAYER, AND METAL LAMINATED FILM

TECHNICAL FIELD

The present invention relates to a biaxially stretched film, a film with a cured resin layer, and a metal-laminated film.

BACKGROUND ART

In recent years, with high performance and high functionality of electric and electronic devices, supporting of high-speed communication of information is required. For example, regarding smartphones, with the start of a high-speed communication service of a 5G (fifth generation mobile communication system), high-speed communication services are becoming widespread not only in consumer fields but also in industrial fields (e.g., factories and vehicles such as automobiles).

Radio waves in the "millimeter wave" (wavelength: 1 to 10 mm, frequency: 30 to 300 GHz) band are used for high-speed and large-capacity data communication of 5 G. Advantages of millimeter waves include a large amount of data that can be transmitted at a time, and a high definition of images to be obtained.

On the other hand, when a high-frequency digital signal such as a millimeter wave is passed through a circuit board, a dielectric loss occurs in which a part of the transmitted digital signal is consumed as heat on the wiring of the circuit board, and a so-called "transmission loss" occurs in which the digital signal reaches the reception side as an attenuated digital signal. Consequently, there is also a situation in which measures for reducing transmission loss are required for members to be used. The transmission loss is the sum of a dielectric loss and a conductor loss, and the dielectric loss $\alpha_d$ is calculated from the following equation (1).

Equation (1)

$$\alpha_d = 27.3 \times \frac{f}{c} \times \sqrt{\varepsilon_r} \times \tan\delta \quad (1)$$

In this, f is a frequency, c is a light speed, $\varepsilon_r$ is a relative permittivity, and tan δ is a dielectric tangent.

For example, in FPC (flexible printed circuits) that are flexible circuit boards formed of a resin film and a copper foil, the resin film is desired to have a reduced dielectric loss $\alpha_d$ for transmission loss reduction. More specifically, attempts to lower $\varepsilon_r$ and tan δ, especially to lower tan δ have been made.

Various materials have been proposed for reducing the dielectric constant and the dielectric tangent of a resin film. Above all, fluororesins typified by polytetrafluoroethylene (PTFE) have low dielectric constant and dielectric tangent, and are widely used as insulating layers for various electric components for handling high-frequency signals (NPL 1).

However, fluororesins are often limited in terms of mechanical properties, processability and cost, and general-purpose resin films are required.

General-purpose resin films include polyester films. The polyester films are excellent in heat resistance, weather resistance, mechanical strength and transparency, and are readily available in terms of price, and are therefore used for various uses such as packaging materials and optical uses, but are not investigated very much for low-dielectric properties.

For example, PTL 1 discloses, as a polyester film having excellent low-dielectric properties, a laminated biaxially stretched polyester film having 5 to 45% by volume of cavities inside it. Having cavities, the film can make voids (air) therein dispersed and has attained dielectric constant reduction and dielectric tangent reduction.

CITATION LIST

Patent Literature

PTL 1: JP 2006-352470 A

Non-Patent Literature

NPL 1: "Koshuhataiobuzai no Kaihatsudoko to 5G, Mirihareda eno Oyo", Gijutujohokyokai, Chap. 3, Sec. 2, pp. 77-84 "Kosoku, Koshuhataio FPC no Kaihatsudoko to Teidensososhitsuka"

SUMMARY OF INVENTION

Technical Problem

In the cavities-containing laminated biaxially-stretched polyester film described in PTL 1, the cavities are formed by mixing different kinds of materials, but in such a case, it is difficult to control the size of the cavities or to control the dispersed condition of the different kinds of materials, and for example, in the case where the dispersed condition of the different kinds of materials is insufficient, desired low-dielectric properties cannot be obtained as the case may be.

An object of the present invention is to solve the above-mentioned problems and to provide a biaxially stretched polyester film having excellent low-dielectric properties without having cavities.

Solution to Problem

The present inventors have made assiduous studies for the purpose of attaining the above-mentioned object and have completed the present invention. In one aspect of the present invention, the following [1] to [22] are summarized.

The gist of the present invention is as follows.

[1] A biaxially stretched film including two or more kinds of polyesters, in which at least one of the polyesters is a polybutylene naphthalate resin (A), and a dielectric tangent at 28 GHz is 0.0040 or less.

[2] The biaxially stretched film according to the above [1], in which a relative permittivity at 28 GHz is 3.15 or more and 3.25 or less.

[3] The biaxially stretched film according to the above [1] or [2], wherein a tensile strength at break in both a machine direction (MD) and a transverse direction (TD) is 150 MPa or more.

[4] The biaxially stretched film according to any of the above [1] to [3], wherein a storage elastic modulus in dynamic viscoelastic measurement at 23° C. in both the machine direction (MD) and the transverse direction (TD) is 3.5 GPa or more.

[5] The biaxially stretched film according to any of the above [1] to [4], wherein the tensile strength at break in both the machine direction (MD) and the transverse direction (TD) when the film is allowed to stand for 96 hours in an environment of 120° C. and 85% RH and then is allowed to stand at room temperature (23° C.) for 18 hours is 100 MPa or more.

[6] The biaxially stretched film according to any of the above [1] to [5], wherein a strength retention in both the machine direction (MD) and the transverse direction (TD) when the film is allowed to stand for 96 hours in an environment of 120° C. and 85% RH and then is allowed to stand at room temperature (23° C.) for 18 hours is 50% or more.

[7] The biaxially stretched film according to any of the above [1] to [6], including the polybutylene naphthalate resin (A) in an amount of 35% by mass or more and 70% by mass or less.

[8] The biaxially stretched film according to any of the above [1] to [7], including a crystalline polyester (B).

[9] The biaxially stretched film according to the above [8], wherein a glass transition temperature of the crystalline polyester (B) is higher than that of the polybutylene naphthalate resin (A).

[10] The biaxially stretched film according to the above [8] of [9], wherein the crystalline polyester (B) is a polyethylene naphthalate resin.

[11] The biaxially stretched film according to the above [10], wherein in the polyethylene naphthalate resin, an acid component having a benzene skeleton as a copolymerization component other than 2,6-naphthalenedicarboxylic acid in a total dicarboxylic acid components accounts for 5 mol % or less.

[12] The biaxially stretched film according to any of the above [1] to [11], having a film thickness of 40 to 150 μm.

[13] A film with a cured resin layer, including a cured resin layer on at least one surface layer of the biaxially stretched film of any of the above [1] to [12], wherein the cured resin layer is formed of a resin composition containing a crosslinking agent in an amount of 70% by mass or more relative to a nonvolatile component therein.

[14] A metal laminated film, including a metal layer on the cured resin layer of the film with the cured resin layer of the above [13].

[15] The metal laminated film according to the above [14], wherein the metal layer is patterned.

[16] The metal laminated film according to the above [14] or [15], wherein the metal layer is formed of copper or silver.

[17] The biaxially stretched film according to any of the above [1] to [12], which is for a high-speed communication circuit.

[18] The biaxially stretched film according to the above [17], which is used as a substrate film for a transparent antenna.

[19] The film with a cured resin layer according to the above [13], which is for a high-speed communication circuit.

[20] The film with a cured resin layer according to the above [19], which is used as a substrate film for a transparent antenna.

[21] The metal laminated film according to any of the above [14] to [16], which is for a high-speed communication circuit.

[22] The metal laminated film according to the above [21], which is used as a substrate film for a transparent antenna.

Advantageous Effects of Invention

The biaxially stretched film, the film with a cured resin layer and the metal laminated film of the present invention have excellent low-dielectric properties.

Consequently, the biaxially stretched film, the film with a cured resin layer and the metal laminated film of the present invention can be favorably used for high-speed communication circuits.

DESCRIPTION OF EMBODIMENTS

The present invention is described in detail hereinunder. However, the present invention is not limited to the embodiments described below.

<<Biaxially Stretched Film>>

The biaxially stretched film of one example of an embodiment of the present invention (hereinafter also referred to as "the present film") contains two or more kinds of polyesters, at least one of which is a polybutylene naphthalate (hereinafter also referred to as "PBN") resin (A), and a dielectric tangent at 28 GHz is 0.0040 or less.

The present film is a biaxially stretched film, and therefore can be a thin film, and in addition, since a specific mixed polyester is used for controlling the dielectric tangent of the film to fall within a specific range, and therefore the film can have low-dielectric properties.

Further, since a specific mixed polyester is used for controlling the crystallization speed of the film, and therefore the present film is excellent in extrusion molding and stretching processing which are difficult to be performed by using the PBN resin (A) alone.

1. Physical Properties

First, the physical properties of the present film are described.

(1) Dielectric Tangent

The present film has a dielectric tangent at 28 GHz of 0.0040 or less, preferably 0.0039 or less, more preferably 0.0038 or less, especially preferably 0.0035 or less, particularly preferably 0.0030 or less. Although not specifically limited, the lower limit is 0.0010 or more, preferably 0.0015 or more, more preferably 0.0020 or more, even more preferably 0.0025 or more.

When the dielectric tangent is 0.0040 or less, the film can be said to have excellent low-dielectric properties, and can be favorably used for high-speed communication circuits.

The dielectric tangent can be controlled by the kind and the content of the polyesters to be mixed, and by the stretching conditions. The dielectric tangent was measured according to the method described in Examples.

(2) Relative Permittivity

The relative permittivity of the present film at 28 GHz is preferably 3.15 or more and 3.25 or less. The upper limit is more preferably 3.24 or less, even more preferably 3.23 or less, especially preferably 3.22 or less, particularly preferably 3.21 or less. Hereinunder the relative permittivity may be referred to as merely as "permittivity".

When the permittivity falls within the range, the film can be said to have excellent low-dielectric properties, and can be favorably used for high-speed communication circuits.

The permittivity can be controlled by the kind and the content of the polyesters to be mixed, and by the stretching conditions. The permittivity was measured according to the method described in Examples.

(3) Tensile Strength at Break

The tensile strength at break of the present film in both the machine direction (MD) and the transverse direction (TD) is preferably 150 MPa or more. More preferably, it is 154 MPa or more, even more preferably 170 MPa or more, especially preferably 173 MPa or more, particularly preferably 175 MPa or more. Not specifically limited, the upper limit in both the machine direction (MD) and the transverse direction (TD) is generally 500 MPa or less, preferably 300 MPa or less.

When the tensile strength at break of 150 MPa or more, the present film can have sufficient mechanical properties.

The tensile strength at break can be controlled by the kind and the content of the polyesters to be mixed, and by the stretching conditions. The tensile strength at break was measured according to the method described in the section of Examples.

In the present invention, the machine direction (MD) of the film means the direction in which the film runs during the production process, that is, the direction in which a film roll is wound.

The transverse direction (TD) of the film means the direction which is parallel to the film surface and which is perpendicular to the machine direction, that is, the direction parallel to the central axis of the roll when the film is wound up into a film roll.

The machine direction (MD) can be referred to also as a lengthwise direction or a longitudinal direction, and the transverse direction (TD) can be referred to also as a lateral direction.

(4) Storage Elastic Modulus

The storage elastic modulus in dynamic viscoelastic measurement at 23° C. in both the machine direction (MD) and the transverse direction (TD) of the present film is preferably 3.5 GPa or more. More preferably, it is 3.6 GPa or more, even more preferably 3.7 GPa or more, further more preferably 3.8 GPa or more. Although not specifically limited, the upper limit is generally 10 GPa or less, preferably 8.0 GPa or less.

When the storage elastic modulus of the present film is 3.5 GPa or more, the film can have good stiffness and is hardly wrinkled, and is therefore excellent in handleability.

The storage elastic modulus is a value determined according to the method described in Examples.

(5) Tensile Properties after Wet Heat Test

The tensile strength at break in both the machine direction (MD) and the transverse direction (TD) when the film is allowed to stand for 96 hours in an environment of 120° C. and 85% RH and then is allowed to stand at room temperature (23° C.) for 18 hours is preferably 100 MPa or more, more preferably 105 MPa or more, even more preferably 110 MPa or more, especially preferably 120 MPa or more, particularly preferably 130 MPa or more. Although not specifically limited, the upper limit is generally 300 MPa or less, preferably 250 MPa or less.

When the tensile strength at break after a wet heat test of the present film is 100 MPa or more, the present film can be excellent in hydrolysis resistance and can have sufficient weather resistance.

The strength retention in both the machine direction (MD) and the transverse direction (TD) when the film is allowed to stand for 96 hours in an environment of 120° C. and 85% RH and then is allowed to stand at room temperature (23° C.) for 18 hours is preferably 50% or more, more preferably 55% or more, even more preferably 60% or more, especially preferably 65% or more. Although not specifically limited, the upper limit is 100% or less.

When the strength retention of the present film after a wet heat test is 50% or more, the present film can have sufficient weather resistance.

(6) Haze

The haze of the present film is preferably 3.0% or less, more preferably 2.0% or less, even more preferably 1.0% or less, especially preferably 0.5% or less. When the haze of the present film is lower than the upper limit, the film can be said to have good transparency.

Although not specifically limited, the lower limit is generally 0.01% or more.

(7) Thermal Shrinkage

The thermal shrinkage of the present film in both the machine direction (MD) and the transverse direction (TD), when heated at 150° C. for 30 minutes, is preferably 5.0% or less. When the thermal shrinkage is 5.0% or less, the film can be excellent in heat resistance, especially in dimensional stability at high temperature, and can be practically used with no problem.

From these viewpoints, the thermal shrinkage of the present film is more preferably 4.0% or less, even more preferably 3.0% or less, especially preferably 2.5% or less. Although not specifically limited, the lower limit is generally 0.010% or more.

(8) Thickness

The thickness of the present film is preferably 1 to 250 μm, more preferably 5 to 200 μm, even more preferably 10 to 150 μm. When the thickness is 1 μm or more, the film strength can be kept within a practicable range. When the thickness is 250 μm or less, the film can be readily incorporated in mobile devices, and can be favorably used for high-speed communication circuits.

In particular, in use as a substrate film for transparent antennas, the thickness of the present film is preferably 40 to 150 μm. The lower limit of the thickness is more preferably 50 μm, even more preferably 75 μm, especially preferably 100 μm. The upper limit of the thickness is preferably 140 μm, more preferably 130 μm.

The thickness can be controlled by the film formation and stretching conditions.

2. Components

Next described are the components that constitute the present film.

The present film contains two or more kinds of polyesters, at least one of which is a PBN resin (A).

It is assumed that, when the present film contains a PBN resin (A), the mechanism thereof having excellent low dielectric properties is not clear, but the movement of the dipoles is suppressed by the stacking of aromatic rings.

In general, when a dielectric substance is placed in an electric field, the dipoles are oriented. With that, the dipoles rotate and invert to follow the phase of the AC electric field. With the rotation and inversion motion of the dipoles, friction occurs to generate dielectric loss.

Accordingly, it is presumed that suppressing the movement of the dipoles leads to excellent low-dielectric properties.

This is described more specifically. From the viewpoint that movement of dipoles is suppressed by stacking of aromatic rings, it is considered that when stacking is stronger, the suppressing effect can be larger. More specifically, it is considered that, by having more naphthalene skeleton than benzene skeleton, better low-dielectric properties can be exhibited. Accordingly, from the viewpoint of low-dielectric properties, the aromatic ring is preferably a naphthalene skeleton rather than a benzene skeleton.

<Polybutylene Naphthalate Resin (A)>

The PBN resin (A) that constitutes the present film is a polyester containing 2,6-naphthalenedicarboxylic acid as a dicarboxylic acid component (a-1) and 1,4-butanediol as a diol component (a-2), and preferably contains 2,6-naphthalenedicarboxylic acid and 1,4-butanediol as main components. Namely, the polyester preferably contains 50 mol % or more of 2,6-naphthalenedicarboxylic acid as a dicarboxylic acid component (a-1) and 50 mol % or more of 1,4-butanediol as a diol component (a-2).

In particular, the PBN resin (A) for use in the present invention more preferably contains 90 mol % or more of 2,6-naphthalenedicarboxylic acid as a dicarboxylic acid component (a-1) and 90 mol % or more of 1,4-butanediol as a diol component (a-2).

The dicarboxylic acid component (a-1) that constitutes the PBN resin (A) contains 2,6-naphthalenedicarboxylic acid, and preferably 92 mol % or more, more preferably 94 mol % or more, especially preferably 96 mol % or more, and particularly preferably 98 mol % or more of the dicarboxylic acid component (a-1) is 2,6-naphthalenedicarboxylic acid, and most preferably all (100 mol %) of the dicarboxylic acid component (a-1) is 2,6-naphthalenedicarboxylic acid. As the dicarboxylic acid component (a-1), when 2,6-naphthalenedicarboxylic acid accounts for 90 mol % or more, the glass transition temperature and the crystallinity of the PBN resin (A) can increase, and eventually the heat resistance and the mechanical properties of the present film can improve. Also when 2,6-naphthalenedicarboxylic acid accounts for 90 mol % or more of the dicarboxylic acid component (a-1), the content of the naphthalene skeleton can increase to enhance the effect of suppressing movement of dipoles by stacking. With that, as a result, the low-dielectric properties can improve.

For the purpose of improving moldability and heat resistance, the PBN resin (A) can be copolymerized with any other acid component than 2,6-naphthalenedicarboxylic acid. Specifically, the comonomer includes an aromatic dicarboxylic acid such as terephthalic acid, isophthalic acid, phthalic acid, 1,4-naphthalenedicarboxylic acid, 1,5-naphthalenedicarboxylic acid, 2,5-furandicarboxylic acid, 2,4-furandicarboxylic acid, 3,4-furandicarboxylic acid, benzophenonedicarboxylic acid, 4,4'-diphenyldicarboxylic acid, 3,3'-diphenyldicarboxylic acid, and 4,4'-diphenylether-dicarboxylic acid; and an aliphatic dicarboxylic acid such as cyclohexanedicarboxylic acid, oxalic acid, malonic acid, succinic acid, glutaric acid, adipic acid, pimelic acid, suberic acid, azelaic acid, and sebacic acid. Among these, from the viewpoint of moldability, preferred are isophthalic acid, 2,5-furandicarboxylic acid, 2,4-furandicarboxylic acid, and 3,4-furandicarboxylic acid. Also among these, from the viewpoint of low-dielectric properties, preferred is an acid component having a naphthalene skeleton with strong stacking capability, and for example, an acid component having a benzene skeleton such as terephthalic acid and isophthalic acid preferably accounts for 5 mol % or less, more preferably 3 mol % or less, even more preferably 1 mol % or less. One kind alone or two or more kinds of these acid components can be used either singly or as combined.

The content of the other acid component than 2,6-naphthalenedicarboxylic acid is preferably 10 mol % or less of the total acid component containing 2,6-naphthalenedicarboxylic acid.

The diol component (a-2) that constitutes the PBN resin (A) contains 1,4-butanediol, and among the diol component (a-2), preferably, 1,4-butanediol accounts for 92 mol % or more, more preferably 94 mol % or more, especially preferably 96 mol % or more, particularly preferably 98 mol % or more, and most preferably, all (100 mol %) of the diol component (a-2) is 1,4-butanediol. When 1,4-butanediol accounts for 90 mol % or more of the diol component (a-2), the compatibility with the polyester to be mixed can improve, and further the glass transition temperature and the crystallinity of the PBN resin (A) can increase, and eventually the heat resistance and the mechanical properties of the present film can improve.

For the purpose of improving moldability and heat resistance, the PBN resin (A) can be copolymerized with any other diol component than 1,4-butanediol. Specifically, the comonomer includes 1,2-propanediol, 1,3-propanediol, 1,5-pentanediol, 1,6-hexanediol, neopentyl glycol, ethylene glycol, diethylene glycol, triethylene glycol, polyalkylene glycol, 1,2-cyclohexanedimethanol, 1,3-cyclohexanedimethanol, 1,4-cyclohexanedimethanol, hydroquinone, bisphenol, spiroglycol, 2,2,4,4-tetramethylcyclobutane-1,3-diol, and isosorbide. Among these, from the viewpoint of moldability, preferred are ethylene glycol, diethylene glycol, 1,3-propanediol, 1,3-cyclohexanedimethanol, and 1,4-cyclohexanedimethanol. One kind alone or two or more kinds of these diol components can be used either singly or as combined.

The content of the other diol component than 1,4-butanediol is preferably 10 mol % or less of the total diol component containing 1,4-butanediol.

The content of the PBN resin (A) is preferably 5% by mass or more and 70% by mass or less, based on 100% by mass of the biaxially stretched film. When the content is 5% by mass or more, the low-dielectric properties that the PBN resin (A) has can be exhibited. When the content is 70% by mass or less, a suitable content of at least one polyester to be mentioned below can be secured, and therefore the balance of low-dielectric properties, mechanical properties and weather resistance can be bettered while improving extrusion moldability and stretching processability in film formation.

In particular, from the viewpoint of bettering low-dielectric properties, the content of the PBN resin (A) is preferably 35% by mass or more and 70% by mass or less, more preferably 40% by mass or more and 65% by mass or less, even more preferably 45% by mass or more and 62% by mass or less, and especially preferably 50% by mass or more and 60% by mass or less.

The glass transition temperature of the PBN resin (A) (Tg(A)) is preferably 50° C. or higher and 130° C. or lower, more preferably 58° C. or higher and 125° C. or lower, even more preferably 65° C. or higher and 120° C. or lower. When the glass transition temperature (Tg(A)) falls within the range, the balance of heat resistance and extrusion moldability can be excellent.

The glass transition temperature (Tg(A)) can be measured according to the method described in Examples.

<At Least One Kind of Polyester>

The present film is composed of a mixed polyester containing at least one kind of polyester in addition to the PBN resin (A).

The at least one kind of polyester is not specifically limited, and includes those formed of a dicarboxylic acid component and a diol component mentioned below.

The dicarboxylic acid component includes terephthalic acid, isophthalic acid, orthophthalic acid, phthalic acid, 4,4'-diphenyldicarboxylic acid, 2,5-naphthalenedicarboxylic acid, 1,5-naphthalenedicarboxylic acid, 2,6-naphthalenedicarboxylic acid, 2,7-naphthalenedicarboxylic acid, 1,4-cyclohexanedicarboxylic acid, 2-potassium-sulfoterephthalic acid, 5-sodium-sulfoisophthalic acid, adipic acid, azelaic acid, sebacic acid, dodecanedicarboxylic acid, glutaric acid, succinic acid, trimellitic acid, trimesic acid, pyromellitic acid, trimellitic anhydride, phthalic anhydride, p-hydroxybenzoic acid, monopotassium trimellitate, and ester-forming derivatives thereof.

The diol component includes ethylene glycol, 1,2-propylene glycol, 1,3-propylene glycol, 1,4-butanediol, 1,6-hexanediol, 2-methyl-1,5-pentanediol, neopentyl glycol, 1,4-cyclohexanedimethanol, p-xylylene glycol, bisphenol A ethylene glycol adduct, diethylene glycol, triethylene glycol, polyethylene glycol, polypropylene glycol, polytetramethylene glycol, polytetramethylene oxide glycol, dimethylolpropionic acid, glycerin, trimethylolpropane, sodium dimethylolethylsulfonate, and potassium dimethylolpropionate.

One kind or more are selected from each group of the above-mentioned components, and can be synthesized in ordinary polycondensation reaction to give polyesters.

Polyesters corresponding to the PBN resin (A) can fall within the scope of the above-mentioned at least one kind of polyester, but in the mixed polyester in the present invention, one different from the PBN resin (A) is used as the at least one kind of polyester.

The at least one kind of polyester is preferably a crystalline polyester (B), and more preferably, the crystalline polyester (B) has a higher glass transition temperature than the PBN resin (A).

By mixing the PBN resin (A) and the crystalline polyester (B), the crystallization speed of the PBN resin (A) can be controlled to give a film excellent in extrusion moldability and stretching processability.

Since the glass transition temperature of the crystalline polyester (B) is higher than that of the PBN resin (A), a resin composition having a higher glass transition temperature than the PBN resin (A) alone can be produced to better heat resistance.

Further, by mixing with the crystalline polyester (B), high crystallinity can be maintained, and the film can be excellent in the balance of low-dielectric properties, mechanical properties and weather resistance.

As the crystalline polyester (B), preferred are a polyethylene naphthalate resin and a polycyclohexylene dimethylene terephthalate resin. From the viewpoint of improving the balance of low-dielectric properties, mechanical properties and weather resistance, more preferably, a polyethylene naphthalate (hereinafter also referred to as "PEN") resin is contained. A polyethylene naphthalate resin has a naphthalene skeleton in the structure and therefore has a high effect of suppressing the movement of dipoles by stacking of aromatic rings, and accordingly the low-dielectric properties of the present film can be bettered further.

(Polyethylene Naphthalate Resin)

The PEN resin can be a homopolyester or a copolyester, but preferably, the acid component having a benzene skeleton as the other comonomer component than 2,6-naphthalenedicarboxylic acid in the total dicarboxylic acid component accounts for 5 mol % or less. Not containing any other comonomer component, all (100 mol %) of the dicarboxylic acid components can be 2,6-naphthalenedicarboxylic acid.

Above all, a homopolyester is preferred from the viewpoint of maintaining high crystallinity. Also from the viewpoint of increasing the content of a naphthalene skeleton to enhance the effect of suppressing movement of dipoles by stacking and readily improving low-dielectric properties, a homopolyester is preferred.

A homopolyester and a copolyester can be blended, but in the case where a homopolyester is blended with one kind of copolyester, two kinds of the above-mentioned crystalline polyesters (B) are used.

In the case where the PEN resin is a homopolyester, it can be prepared by polycondensation of 2,6-naphthalenedicarboxylic acid as a dicarboxylic acid component (b-1) and ethylene glycol as a diol component (b-2).

On the other hand, when the PEN resin is a copolyester, 2,6-naphthalenedicarboxylic acid is an essential component as the dicarboxylic acid component (b-1), as needed, any other comonomer is added thereto.

The other comonomer component includes an aromatic dicarboxylic acid such as terephthalic acid, isophthalic acid, phthalic acid, 1,4-naphthalenedicarboxylic acid, 1,5-naphthalenedicarboxylic acid, 2,5-furandicarboxylic acid, 2,4-furandicarboxylic acid, 3,4-furandicarboxylic acid, benzophenonedicarboxylic acid, 4,4'-diphenyldicarboxylic acid, 3,3'-diphenyldicarboxylic acid, and 4,4'-diphenylether-dicarboxylic acid; an aliphatic dicarboxylic acid such as cyclohexanedicarboxylic acid, oxalic acid, malonic acid, succinic acid, glutaric acid, adipic acid, pimelic acid, suberic acid, azelaic acid, sebacic acid, and dimer acid; and a hydroxycarboxylic acid such as p-hydroxybenzoic acid. Among these, from the viewpoint of moldability, preferred are isophthalic acid, 2,5-furandicarboxylic acid, 2,4-furandicarboxylic acid, and 3,4-furandicarboxylic acid. Also among these, from the viewpoint of low-dielectric properties, preferred is a comonomer component having a naphthalene skeleton with strong stacking capability. One kind alone or two or more kinds of these comonomer components can be used either singly or as combined.

Ethylene glycol is an essential component as the diol component (b-2), and as needed, it can be copolymerized with any other comonomer component that includes 1,2-propanediol, 1,3-propanediol, 1,4-butanediol, 1,5-pentanediol, 1,6-hexanediol, neopentyl glycol, diethylene glycol, triethylene glycol, propylene glycol, polyalkylene glycol, 1,2-cyclohexanedimethanol, 1,3-cyclohexanedimethanol, hydroquinone, spiroglycol, 2,2,4,4-tetramethylcyclobutane-1,3-diol, isosorbide, 1,4-cyclohexanedimethanol, polytetramethylene ether glycol, dimer diol, and bisphenols (bisphenol compounds such as bisphenol A, bisphenol F or bisphenol S, or derivatives thereof or ethylene oxide additives thereof). Among these, preferred are 1,4-cyclohexanedimethanol, polytetramethylene ether glycol, dimer diol and bisphenols. Especially from the viewpoint of film strength retention, bisphenols are preferably used.

As bisphenols, preferably used is bisphenol A-ethylene oxide. One kind alone or two or more kinds of these comonomer components can be used either singly or as combined.

Preferably, the copolyester to constitute the PEN resin contains 2,6-naphthalenedicarboxylic acid as the dicarboxylic acid component (b-1), and ethylene glycol and bisphenol A ethylene oxide adduct as the diol component (b-2).

The copolyester contains, in the dicarboxylic acid component, any other comonomer component preferably in an amount of 0 mol % or more and 10 mol % or less, more preferably 0 mol % or more and 8 mol % or less, even more preferably 0 mol % or more and 6 mol % or less, especially preferably 0 mol % or more and 4 mol % or less, further particularly preferably 0 mol % or more and 2 mol % or less.

When the content of the other comonomer component in the dicarboxylic acid component falls within the above numerical range, the glass transition temperature and the crystallinity of the copolyester can increase, and eventually the heat resistance and mechanical properties of the present film can improve.

As an especially preferred embodiment, a comonomer component having a naphthalene skeleton with strong stacking capability is used as the other comonomer component as mentioned above, and for example, the content of the acid component having a benzene skeleton such as terephthalic acid and isophthalic acid is preferably 5 mol % or less, more preferably 3 mol % or less, even more preferably 1 mol % or less.

The copolyester contains, in the dicarboxylic acid component, 2,6-naphthalenedicarboxylic acid preferably in an amount of 90 mol % or more, more preferably 92 mol % or more, even more preferably 94 mol % or more, especially preferably 96 mol % or more, particularly preferably 98 mol % or more. 2,6-naphthalenedicarboxylic acid may account for all (100 mol %) of the dicarboxylic acid component.

When the content of the 2,6-naphthalenedicarboxylic acid in the dicarboxylic acid component falls within the above numerical range, the glass transition temperature and the crystallinity of the copolyester can increase and eventually the heat resistance and the mechanical properties of the present film can improve. In addition, when the content of the 2,6-naphthalenedicarboxylic acid in the dicarboxylic acid component falls within the above numerical range, the content of the naphthalene skeleton can increase and the effect of suppressing the movement of dipoles by stacking can increase. With that, as a result, the low-dielectric properties can improve.

The copolyester contains, in the diol component, any other comonomer component preferably in an amount of 4 mol % or more and 70 mol % or less, more preferably 4.2 mol % or more and 60 mol % or less, even more preferably 4.4 mol % or more and 50 mol % or less, especially preferably 4.6 mol % or more and 40 mol % or less, particularly preferably 4.8 mol % or more and 30 mol % or less.

When the content of the other comonomer component in the diol component falls within the above numerical range, the glass transition temperature of the copolyester can increase and eventually the heat resistance of the present film can improve.

In addition, the crystallinity can be controlled and therefore the crystallization speed can be lowered so that the extrusion moldability and the stretching processability of the film can be thereby improved.

When the content is 70 mol % or less, the melting point does not increase too much. Consequently, the molding temperature need not to be set high, causing no concern of thermal decomposition.

The copolyester contains ethylene glycol in the diol component preferably in an amount of 30 mol % or more and 96 mol % or less, more preferably 40 mol % or more and 95.8 mol % or less, even more preferably 50 mol % or more and 95.6 mol % or less, especially preferably 60 mol % or more and 95.4 mol % or less, particularly preferably 70 mol % or more and 95.2 mol % or less.

When the content of ethylene glycol in the diol component falls within the above numerical range, the crystallinity of the copolyester can be maintained, and eventually the heat resistance of the present film improves.

The content ratio of the crystalline polyester (B) such as the PEN resin is, from the viewpoint of the balance of low-dielectric properties, mechanical properties, weather resistance and moldability, preferably 50 parts by mass or more and 1000 parts by mass or less, more preferably 55 parts by mass or more and 980 parts by mass or less, even more preferably 60 parts by mass or more and 950 parts by mass or less, especially preferably 65 parts by mass or more and 900 parts by mass or less, relative to 100 parts by mass of the PBN resin (A).

When the content ratio of the crystalline polyester (B) in the present film is 50 parts by mass or more, the crystallization speed can be made low, and extrusion moldability and stretching processability in film formation can be therefore improved.

In addition, when it is 50 parts by mass or more, the glass transition temperature can increase and the heat resistance of the present film can be thereby improved.

On the other hand, when the content ratio of the crystalline polyester (B) is 1000 parts by mass or less, the balance of the low-dielectric properties, the mechanical properties and the weather resistance of the PBN resin (A) is not worsened too much, and therefore the balance of the low-dielectric properties, the mechanical properties and the weather resistance of the present film to be obtained can be bettered.

Above all, from the viewpoint of bettering the low-dielectric properties, the content ratio of the crystalline polyester (B) such as the PEN resin is preferably 50 parts by mass or more and 185 parts by mass or less, more preferably 55 parts by mass or more and 150 parts by mass or less, even more preferably 60 parts by mass or more and 125 parts by mass or less, especially preferably 65 parts by mass or more and 110 parts by mass or less, relative to 100 parts by mass of the PBN resin (A).

For example, in the case where the PEN resin is used as the crystalline polyester (B), both the PBN resin (A) and the PEN resin are resins having a naphthalene skeleton, and an increase in the PBN resin (A) lowers dielectric tangent and betters low-dielectric properties. The reason is considered to be closely related with density.

A permittivity is a parameter to indicate the degree of polarization, and when the number of molecules per unit volume is larger, the sum total of dipoles increases. Accordingly, it is considered that when a density is higher, a permittivity is larger.

On the other hand, a dielectric tangent is a parameter to indicate the degree of energy loss that is caused by vibration of dipoles in application of AC voltage. From this, it is considered that, in the case of a high density, the energy loss, that is, the dielectric tangent can be lower due to the mutual cancellation of the vibration of the dipoles.

Namely, in the case where the present film contains the PBN resin (A) and the PEN resin, the density can increase with the increase in the content of the PBN resin (A), and therefore the dielectric tangent can effectively lower.

In addition, the crystalline polyester (B) for use in the present invention has a higher glass transition temperature than the PBN resin (A), and the glass transition temperature difference between the two is preferably 20° C. or more, more preferably 30° C. or more, even more preferably 40° C. or more.

When the glass transition temperature difference between the PBN resin (A) and the crystalline polyester (B) is not lower than the lower limit, the glass transition temperature of the present film can fall within a suitable range, and a film excellent in heat resistance and extrusion moldability can be obtained.

Although not specifically limited, the upper limit of the glass transition temperature difference between the PBN resin (A) and the crystalline polyester (B) is generally 150° C. or less, preferably 100° C. or less.

The glass transition temperature of the crystalline polyester (B) (Tg(B)) is preferably 70° C. or higher and 200° C. or lower, more preferably 75° C. or higher and 190° C. or lower, even more preferably 80° C. or higher and 180° C. or lower. When the glass transition temperature of the crystalline polyester (B) falls within the range, the glass transition temperature of the present film can fall within a suitable range, and a film excellent in heat resistance and extrusion moldability can be obtained.

The glass transition temperature can be measured according to the method described in Examples.

<Other Resins>

The present film can contain any other resin than the PBN resin (A) and the at least one polyester mentioned above, within a range not detracting from the advantageous effects of the present invention.

The other resin include a polystyrene resin, a polyvinyl chloride resin, a polyvinylidene chloride resin, a polyethylene chloride resin, a polycarbonate resin, a polyamide resin, a polyacetal resin, an acrylic resin, an ethylene-vinyl acetate copolymer, a polymethylpentene resin, a polyvinyl alcohol resin, a cycloolefinic resin, a polylactic acid resin, a polybutylene succinate resin, a polyacrylonitrile resin, a polyethylene oxide resin, a cellulose resin, a polyimide resin, a polyurethane resin, a polyphenylene sulfide resin, a polyphenylene ether resin, a polyvinyl acetal resin, a polybutadiene resin, a polybutene resin, a polyamide-imide resin, a polyamide-bismaleimide resin, a polyether imide resin, a polyether ether ketone resin, a polyether ketone resin, a polyether sulfone resin, a polyketone resin, a polysulfone resin, an aramid resin, and a fluororesin.

<Particles>

The present film can contain particles for the main purposes of imparting lubricity and preventing scratching in processing steps. Without being specifically limited, the kind of the particles to be incorporated can be any particles capable of imparting lubricity, and specific examples thereof include inorganic particles of silica, calcium carbonate, magnesium carbonate, barium carbonate, calcium sulfate, calcium phosphate, magnesium phosphate, kaolin, aluminum oxide or titanium oxide; and organic particles of acrylic resin, styrene resin, urea resin, phenol resin, epoxy resin, or benzoguanamine resin. Further, during the polymer production process for polyesters, a part of a metal compound such as a catalyst can be precipitated and finely dispersed, and the precipitated particles can be used.

<Additive>

The present film can appropriately contain an additive that is generally incorporated. The additive includes a recycled resin to occur from edge trimming loss, as well as a pigment such as titanium oxide and carbon black, and flame retardant, weather stabilizer, heat stabilizer, antistatic agent, melt viscosity improver, crosslinking agent, lubricant, nucleating agent, plasticizer, antiaging agent, antioxidant, light stabilizer, UV absorbent, neutralizing agent, antifogging agent, antiblocking agent, slipping agent, and colorant, which are added for the purpose of improving or controlling molding processability, productivity and various physical properties of porous films.

3. Production Method

Next described is a production method for the present film.

A production method for the biaxially stretched film of the present invention is described, but the following description is for one example of a method for producing the present film, and the present film is not limited to the films to be produced according to the production method mentioned below.

One example of an embodiment of the present invention for a production method for the present film is a production method that includes molding a resin composition containing a PBN resin (A) and at least one kind of polyester into a film and biaxially stretching the resultant film.

The method of preparing a resin composition by kneading a PBN resin (A) and at least one kind of polyester, and any other resin and an additive is not specifically limited, but for the purpose of obtaining the resin composition in a manner as simple as possible, preferably, the components are melt-kneaded to give the resin composition, using an extruder. For the purpose of uniformly mixing the raw materials to constitute the resin composition, preferably the materials are melt-kneaded with a unidirectional twin-screw extruder.

The kneading temperature is not lower than the glass transition temperature (Tg) of all the polymers used, and for crystalline resins, the temperature is preferably not lower than the crystal melting temperature (Tm) of the polymers. Relative to the glass transition temperature (Tg) and the crystal melting temperature (Tm) of the polymers used, the kneading temperature is preferably as high as possible, since interesterification reaction of some polymers may occur readily to improve compatibility, but when the kneading temperature is too high over necessity, that is unfavorable since resin decomposition may occur. From this, the kneading temperature is preferably 255° C. or higher and 340° C. or lower, more preferably 260° C. or higher and 330° C. or lower, even more preferably 270° C. or higher and 320° C. or lower, especially preferably 280° C. or higher and 310° C. or lower. When the kneading temperature falls within the range, compatibility and melt moldability can be improved without causing polymer decomposition.

The resultant resin composition can be formed into a biaxially stretched film according to an ordinary molding method of, for example, extrusion molding, injection molding, blow molding, vacuum molding, compressed-air molding or pressure molding. In each molding method, the apparatus and the processing condition are not specifically limited.

Preferably, the present film is produced, for example, according to the following method.

From the resin composition prepared by mixing, a substantially amorphous and unoriented film (hereinafter also referred to as "unstretched film") is produced according to an extrusion method. For production of the unstretched film, for example, employable is an extrusion method where the above-mentioned raw materials are melted with an extruder, then extruded out through a flat die or a circular die, and thereafter rapidly cooled to give a flat or circular unstretched film. At that time, as the case may be, the film can be made to have a laminate structure, using plural extruders.

Next, the unstretched film is stretched in the machine direction (MD) of the film and in a transverse direction (TD) perpendicular thereto, generally by 1.1 to 5.0 times at least in one direction, from the viewpoint of the stretching effect and the film strength, preferably by 1.1 to 5.0 times in both the two, longitudinal and lateral directions.

As the biaxially stretching method, employable is any conventionally known stretching method of, for example, tenter-type successive biaxially stretching, tenter-type simultaneous biaxially stretching, or tubular simultaneous biaxially stretching. For example, in the case of a tenter-type successive biaxially stretching method, an unstretched film is heated at a temperature falling within a temperature range of Tg to Tg+60° C. where Tg is a glass transition temperature of the resin composition, then stretched in the longitudinal direction by 1.1 to 5.0 times, preferably by 1.5 to 4.5 times, more preferably by 2.0 to 4.0 times using a roll-type longitudinal stretching machine, and subsequently stretched in the lateral direction at a temperature falling within a temperature range of Tg to Tg+60° C. by 1.1 to 5.0 times, preferably by 1.5 to 4.8 times, more preferably by 2.0 to 4.6 times using a tenter-type lateral stretching machine, thereby producing a biaxially stretched film. When the draw ratio falls within the range, the film can be uniformly stretched to induce orientation crystallization thereby providing a film strength falling within a range favorable for use of displays.

In the case of a tenter-type simultaneous biaxially stretching or tubular simultaneous biaxially stretching method, for example, an unstretched film is stretched at a temperature falling within a temperature range of Tg to Tg+60° C. by 1.1 to 5.0 times both in the two, longitudinal and lateral directions to give a biaxially stretched film.

The biaxially stretched film stretched according to the above-mentioned method is subsequently thermally fixed. By thermal fixing, the film can be given dimensional stability at room temperature. The treatment temperature in that case is preferably selected from the range of Tm-1 to Tm-80° C. where Tm is a crystal melting temperature of the resin composition. When the thermal fixing temperature falls within the above range, thermal fixation can be attained sufficiently, thus the stress in stretching can be relieved, sufficient heat resistance and mechanical properties can be given to the film, and the resultant film is excellent with no trouble of breakage or whitening of film surface.

In the present invention, for relieving the stress of crystallization shrinkage by thermal fixation, preferably, the film is relaxed in the lateral direction by 0 to 15% during thermal fixation, preferably by 3 to 10%. When the relaxing treatment is sufficiently performed so that the film can be uniformly relieved in the lateral direction, the shrinkage in the lateral direction can be uniform and a film excellent in room temperature dimensional stability can be obtained. In addition, as relieved to follow shrinkage, the film can be free from sagging or fluttering in the tenter, and does not break.

4. Use

The biaxially stretched film of the present invention has excellent low-dielectric properties.

Accordingly, the film can be favorably used for high-speed communication circuits. Use for high-speed communication circuits includes FPC (flexible printed circuits) that are flexible circuit substrates formed of a resin film and a copper foil, and transparent antennas with a nonvisible ultra-fine metal mesh wiring on a transparent film. Above all, in the case where the present film has high transparency, it can be favorably used as a substrate film for transparent antennas that are required to have high transparency.

The transparent antenna does not detract from design properties, and can therefore be stuck not only to mobile devices but also to buildings such as windowpanes or to glass of vehicle bodies so as to receive 5G radio waves. In the case where the present film additionally has sufficient weather resistance, it can also be favorably used in outdoor applications.

<<Film with Cured Resin Layer>>

The biaxially stretched film of the present invention can optionally have a cured resin layer on at least one surface layer thereof for the purpose of improving adhesiveness to a metal layer, and the cured resin layer is preferably formed of a resin composition containing a crosslinking agent in an amount of 70% by mass or more relative to the nonvolatile component therein. In particular, a cured resin layer is formed on both surface layers of the biaxially stretched film. Here, the biaxially stretched film having a cured resin layer is referred to as a film with a cured resin layer, and is differentiated from the biaxially stretched film.

Between the biaxially stretched film and the cured resin layer, any other layer may be arranged.

1. Physical Properties

First described are the physical properties of the film with a cured resin layer of the present invention.

(1) Oligomer (Ester Circular Trimer) Precipitation Amount

The cured resin layer in the present invention is effective not only for improving adhesiveness to metal layers but also for preventing precipitation of oligomers on the film surface by heating. By reducing oligomer precipitation, visibility reduction owing to whitening of film appearance that may occur by oligomer precipitation and whitening can be suppressed.

In an embodiment having a cured resin layer on both surface layers of a biaxially stretched film of the film with a cured resin layer of the present invention, the precipitation amount of the oligomer (ester cyclic trimer) on at least one cured resin layer surface is preferably 0.50 mg/m$^2$ or less, more preferably 0.40 mg/m$^2$ or less, even more preferably 0.30 mg/m$^2$ or less, further more preferably 0.20 mg/m$^2$ or less.

When the oligomer precipitation amount is 0.50 mg/m$^2$ or less, that is favorable since visibility reduction owing to film appearance whitening to be caused by oligomer precipitation and crystallization on the surface can be suppressed and there occurs neither generation of defects in post processing nor contamination of members in a process. Although not specifically limited, the lower limit is 0.01 mg/m$^2$ or more.

The oligomer precipitation amount is a value determined according to the method described in Examples.

(2) Thickness

The thickness (after dried) of the cured resin layer is preferably 0.003 to 1.0 μm, more preferably 0.005 to 0.5 μm, even more preferably 0.01 to 0.2 μm. When the thickness is 1.0 μm or less, the appearance and the blocking resistance of the cured resin layer can be sufficient. On the other hand, when the thickness is 0.003 Vim or more, the oligomer precipitation amount on the film is small, and the film is therefore good.

2. Components

Next described are the components constituting the cured resin layer.

As described above, the cured resin layer is preferably formed of a resin composition containing a crosslinking agent in an amount of 70% by mass or more relative to the nonvolatile component therein.

<Crosslinking Agent>

As the crosslinking agent, various known crosslinking agents can be used. Examples thereof include an oxazoline compound, a melamine compound, an epoxy compound, an isocyanate compound, a carbodiimide compound, and a silane coupling agent.

Among these, in the case where a metal layer is arranged on the cured resin layer, from the viewpoint that the durability and adhesiveness can improve, an oxazoline compound is favorably used.

Also from the viewpoint of prevention of oligomer precipitation on the film surface by heating and of improvement of durability of the cured resin layer, a melamine compound is favorably used.

(Oxazoline Compound)

The oxazoline compound is a compound having an oxazoline group in the molecule, and in particular, a polymer having an oxazoline group is preferred, which can be produced by homopolymerization of an addition-polymerizable oxazoline group-containing monomer alone or copolymerization thereof with any other monomer. The addition-polymerizable oxazoline group-containing monomer includes 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline and 2-isopropenyl-5-ethyl-2-oxazoline. One kind alone or a mixture of two or more kinds thereof can be used. Among these, 2-isopropenyl-2-oxazoline is industrially available and is favorable.

The other monomer is not specifically limited so far as it is a monomer copolymerizable with the addition-polymerizable oxazoline group-containing monomer, and examples thereof include an alkyl (meth)acrylate, in which the alkyl group includes a methyl group, an ethyl group, an n-propyl group, an isopropyl group, an n-butyl group, an isobutyl group, a t-butyl group, a 2-ethylhexyl group and a cyclohexyl group. Examples also include unsaturated carboxylic acids such as acrylic acid, methacrylic acid, itaconic acid, maleic acid, fumaric acid, crotonic acid, styrenesulfonic acid, and salts thereof. Examples of the salts include sodium salts, potassium salts, ammonium salts and tertiary amine salts. Examples of the monomer further include unsaturated nitriles such as acrylonitrile and methacrylonitrile; and unsaturated amides such as (meth)acrylamide, N-alkyl (meth)acrylamide and N,N-dialkyl(meth)acrylamide, in which examples of the alkyl group include a methyl group, an ethyl group, an n-propyl group, an isopropyl group, an n-butyl group, an isobutyl group, a t-butyl group, a 2-ethylhexyl group and a cyclohexyl group. As examples thereof, further mentioned are vinyl esters such as vinyl acetate and vinyl propionate; vinyl ethers such as methyl vinyl ether and ethyl vinyl ether; α-olefins such as ethylene and propylene; halogen-containing α,β-unsaturated monomers such as vinyl chloride and vinylidene chloride; and α,β-unsaturated aromatic monomers such as styrene and α-methylstyrene. One kind or two or more kinds of these monomers can be used.

From the viewpoint of improvement of durability of the cured resin layer, the oxazoline group amount in the oxazoline compound is preferably within a range of 0.5 to 10 mmol/g, more preferably 3 to 9 mmol/g, even more preferably 5 to 8 mmol/g.

(Melamine Compound)

The melamine compound is a compound having a melamine skeleton in the compound. Examples thereof include an alkylolated melamine derivative, a partially or completely etherified compound formed by reaction of an alkylated melamine derivative with an alcohol, and a mixture thereof. The alcohol for use for etherification is preferably methyl alcohol, ethyl alcohol, isopropyl alcohol, n-butanol and isobutanol.

The melamine compound can be any of a monomer, or a dimer or a higher multimer, and can also be a mixture thereof. Further, one produced by condensation of a part of melamine with urea or the like can also be used, and a catalyst can be used for enhancing the reactivity of the melamine compound.

(Epoxy Compound)

The epoxy compound is a compound having an epoxy group in the molecule, and examples thereof include condensation products with a hydroxy group or an amino group, such as epichlorohydrin, ethylene glycol, polyethylene glycol, glycerin, polyglycerin and bisphenol A, as well as a polyepoxy compound, a diepoxy compound, a monoepoxy compound, and a glycidylamine compound.

Examples of the polyepoxy compound include sorbitol polyglycidyl ether, polyglycerol polyglycidyl ether, pentaerythritol polyglycidyl ether, diglycerol polyglycidyl ether, triglycidyl tris(2-hydroxyethyl)isocyanate, glycerol polyglycidyl ether and trimethylolpropane polyglycidyl ether.

Examples of the diepoxy compound include neopentyl glycol diglycidyl ether, 1,6-hexanediol diglycidyl ether, resorcin diglycidyl ether, ethylene glycol diglycidyl ether, polyethylene glycol diglycidyl ether, propylene glycol diglycidyl ether, polypropylene glycol diglycidyl ether and polytetramethylene glycol diglycidyl ether.

Examples of the monoepoxy compound include allyl glycidyl ether, 2-ethylhexyl glycidyl ether, and phenyl glycidyl ether. Examples of the glycidylamine compound include N,N,N',N'-tetraglycidyl-m-xylylenediamine, and 1,3-bis(N,N-diglycidylamino)cyclohexane.

(Isocyanate Compound)

The isocyanate compound is an isocyanate, or a compound having an isocyanate derivative structure typified by a blocked isocyanate. Examples of the isocyanate include an aromatic isocyanate such as tolylene diisocyanate, xylylene diisocyanate, methylenediphenyl diisocyanate, phenylene diisocyanate, and naphthalene diisocyanate; an aliphatic isocyanate having an aromatic ring, such as α,α, α', α'-tetramethylxylylene diisocyanate; an aliphatic isocyanate such as methylene diisocyanate, propylene diisocyanate, lysine diisocyanate, trimethylhexamethylene diisocyanate and hexamethylene diisocyanate; and an alicyclic isocyanate such as cyclohexane diisocyanate, methylcyclohexane diisocyanate, isophorone diisocyanate, methylenebis(4-cyclohexylisocyanate) and isopropylidene dicyclohexyl diisocyanate. As examples, in addition, further mentioned are polymers and derivatives thereof, such as burette-modified products, isocyanurate-modified products, urethodione-modified products and carbodiimide-modified products.

One alone or plural kinds of these can be used either singly or as combined. Among the above-mentioned isocyanates, aliphatic isocyanates or alicyclic isocyanates are more preferred than aromatic isocyanates, for preventing yellowing by UV rays.

In the case of using a blocked isocyanate, examples of the blocking agent include metabisulfites; phenol compounds such as phenol, cresol and ethylphenyl; alcohol compounds such as propylene glycol monomethyl ether, ethylene glycol, benzyl alcohol, methanol and ethanol; active methylene compounds such as methyl isobutanoylacetate, dimethyl malonate, diethyl malonate, methyl acetoacetate, ethyl acetoacetate and acetylacetone; mercaptan compounds such as butylmercaptan, and dodecylmercaptan; lactam compounds such as ε-caprolactam and δ-valerolactam; amine compounds such as diphenylaniline, aniline and ethyleneimine; acid amide compounds such as acetanilide, and acetamide; formaldehyde, and oxime compounds such as acetoaldoxime, acetone oxime, methyl ethyl ketone oxime, and cyclohexanone oxime. One alone or two or more kinds of these can be used either singly or as combined.

For use herein, the isocyanate compound can be a simple substance, or can also be a mixture or a bound compound with various polymers. From the viewpoint of improving the dispersibility and the crosslinking performance of the isocyanate compound, preferred is use of a mixture or a bound compound thereof with a polyester resin or a urethane resin.

(Carbodiimide Compound)

The carbodiimide compound is a compound having a carbodiimide structure, and a compound having one or more carbodiimide structures in the molecule. For attaining better adhesiveness, more preferred is a polycarbodiimide compound having two or more carbodiimide structures in the molecule.

The carbodiimide compound can be synthesized in a conventionally-known technique, for which generally used is condensation reaction of a diisocyanate compound. The diisocyanate compound is not specifically limited, and any of aromatic or aliphatic compounds are usable. Specifically, the compound includes tolylene diisocyanate, xylene diisocyanate, diphenylmethane diisocyanate, phenylene diisocyanate, naphthalene diisocyanate, hexamethylene diisocyanate, trimethylhexamethylene diisocyanate, cyclohexane diisocyanate, methylcyclohexane diisocyanate, isophorone diisocyanate, dicyclohexyl diisocyanate and dicyclohexylmethane diisocyanate.

The content of the carbodiimide group contained in the carbodiimide compound is, in terms of the carbodiimide equivalent (weight [g] of a carbodiimide compound to give 1 mol of a carbodiimide group), generally within a range of 100 to 1000, preferably 250 to 700, more preferably 300 to 500. When the compound falling within the above range is used, the durability of the cured resin layer improves.

Further, within a range not detracting from the subject matter of the present invention, and for the purpose of improving the solubility or dispersibility in water of the polycarbodiimide compound, a surfactant can be added, and a hydrophilic polymer such as a polyalkylene oxide, a dialkylaminoalcohol quaternary ammonium salt, and a hydroxyalkylsulfonic acid salt can also be added.

(Silane Coupling Compound)

The silane coupling compound is an organic silicon compound having an organic functional group and a hydrolysable group such as an alkoxy group in one molecule. Examples thereof include an epoxy group-containing compound such as 3-glycidoxypropylmethyldimethoxysilane, 3-glycidoxypropyltrimethoxysilane, 3-glycidoxypropylmethyldiethoxysilane, 3-glycidoxypropyltriethoxysilane, and 2-(3,4-epoxycyclohexyl)ethyltrimethoxysilane; a vinyl group-containing compound such as vinyltrimethoxysilane and vinyltriethoxysilane; a styryl group-containing compound such as p-styryltrimethoxysilane and p-styryltriethoxysilane; a (meth)acryl group-containing compound such as 3-(meth)acryloxypropyltrimethoxysilane, 3-(meth)acryloxypropyltriethoxysilane, 3-(meth)acryloxypropylmethyldimethoxysilane, and 3-(meth)acryloxypropylmethyldiethoxysilane; an amino group-containing compound such as 3-aminopropyltrimethoxysilane, 3-aminopropyltriethoxysilane, N-2-(aminoethyl)-3-aminopropyltrimethoxysilane, N-2-(aminoethyl)-3-aminopropyltriethoxysilane, N-2-(aminoethyl)-3-aminopropylmethyldimethoxysilane, N-2-(aminoethyl)-3-aminopropylmethyldiethoxysilane, 3-triethoxysilyl-N-(1,3-dimethylbutylidene)propylamine, N-phenyl-3-aminopropyltrimethoxysilane, and N-phenyl-3-aminopropyltriethoxysilane; an isocyanurate group-containing compound such as tris(trimethoxysilylpropyl) isocyanurate, and tris(triethoxysilylpropyl) isocyanurate; and a mercapto group-containing compound such as 3-mercaptopropyltrimethoxysilane, 3-mercaptopropyltriethoxysilane, 3-mercaptopropylmethyldimethoxysilane, and 3-mercaptopropylmethyldiethoxysilane.

One alone or two or more kinds of these crosslinking agents can be used either singly or as combined. Combined use of two or more kinds thereof can improve adhesiveness to a metal layer arranged on the cured resin layer and prevention of oligomer precipitation after heating. In particular, preferred is combined use of an oxazoline compound capable of improving adhesiveness to a metal layer on the cured resin layer, and a melamine compound capable of favorably preventing oligomer precipitation after heating.

For further improving the adhesiveness to a metal layer on the cured resin layer, more preferred is combined use of three or more kinds of crosslinking agents. For a combination of three or more kinds of crosslinking agents, a melamine compound is preferably selected as one crosslinking agent, and a combination of an oxazoline compound and an epoxy compound is preferred as the crosslinking agents to be combined with the melamine compound. More preferred is a combination of a carbodiimide compound and an epoxy compound.

In the case where such a crosslinking agent is contained, a component for accelerating crosslinking, for example, a crosslinking catalyst can be used at the same time.

Regarding the proportion of the crosslinking agent relative to the total nonvolatile component in the resin composition to form the cured resin layer in the present invention, the crosslinking agent preferably accounts for 70% by mass or more, more preferably 80% by mass or more, even more preferably 90% by mass or more. When the proportion is 70% by mass or more, the adhesiveness to a metal layer arranged on the cured resin layer and the effect of preventing oligomer precipitation after heating can be bettered.

<Binder Resin>

The resin composition can contain a binder resin, for the purpose of improving the appearance of the cured resin layer and for improving the adhesiveness to a metal layer arranged on the cured resin layer and within a range not detracting from the subject matter of the present invention.

As the binder resin, any conventionally-known one can be used, but from the viewpoint of improving the adhesiveness to a layer arranged on the cured resin layer, preferred is use of a polyester resin, an acrylic resin and a urethane resin.

<Particles>

The resin composition can contain particles for the purpose of improving blocking and lubricity. The average particle size is, from the viewpoint of film transparency, preferably 1.0 μm or less, more preferably 0.5 μm or less, even more preferably 0.2 μm or less. On the other hand, for more effectively improving lubricity, it is preferably 0.01 μm or more, more preferably 0.03 μm or more, even more preferably a range larger than the film thickness of the cured resin layer.

Specific examples of the particles include silica, alumina, kaolin, calcium carbonate, and organic particles.

Others

Further, within a range not detracting from the subject matter of the present invention, the resin composition can contain, as needed, a crosslinking catalyst, an antifoaming agent, an applicability improver, a tackifier, an organic lubricant, an antistatic agent, a UV absorbent, an antioxidant, a foaming agent, a dye and a pigment.

Various compounds (components) in the cured resin layer can be analyzed, for example, by TOF-SIMS, ESCA or fluorescent X-ray radiation.

3. Production Method

Next described is a method for forming a cured resin layer.

A method for forming a cured resin layer is described below, but the following description is one example of a method for forming a cured resin layer, and the present invention is not limited to the formation method.

In general, the resin composition is preferably diluted with water, an organic solvent or a mixed liquid thereof, and the cured resin layer can be formed by applying the diluted liquid of a resin composition as a coating liquid onto the surface of a film, and followed by drying it.

As a method of applying the coating liquid onto a film, employable is any conventionally-known method of, for example, air doctor coating, blade coating, rod coating, bar coating, knife coating, squeeze coating, impregnation coating, reverse roll coating, transfer roll coating, gravure coating, kiss roll coating, cast coating, spray coating, curtain coating, calender coating or extrusion coating.

For improving the applicability of the coating agent (coating liquid) onto a film, and the adhesiveness thereof, the film can be subjected to chemical treatment, corona discharge treatment or plasma treatment before coating.

The coating method includes in-line coating and off-line coating, and in-line coating is preferred. In-line coating is a coating method in the process of film production. Specifically, in the method, coating is carried out in any stage of melt-extruding the raw materials of polyesters, then stretching, thermally fixing and winding up. In general, any of an unstretched sheet obtained by melting and rapidly cooling, a monoaxially stretched film that has been stretched, a biaxially stretched film before thermal fixation, or a biaxially stretched film before winding up after thermal fixation is coated. Especially preferred is a method of coating a monoaxially stretched film that has been stretched in a machine direction (longitudinal direction) and then stretching the coated film in a transverse direction (lateral direction). In the case where a cured resin layer is formed by in-line coating, it is preferable that the above-mentioned series of compounds are formed into an aqueous solution or an aqueous dispersion to prepare a coating liquid that is intended to have a solid concentration of 0.1 to 50% by mass or so, and the resultant solution or dispersion is used as a coating liquid. Within a range not detracting from the subject matter of the present invention, and for the purpose of improving the dispersibility in water or improving film formability, the coating liquid can contain a small amount of one or more kinds of organic solvents.

Regarding the drying and curing conditions in forming the cured resin layer on a film, there is no specific limitation. For example, in the case where the cured resin layer is arranged by off-line coating, the heat treatment can be carried out preferably at 80 to 200° C. for 3 to 40 seconds, more preferably at 100 to 180° C. for 3 to 40 seconds, as a rough indication.

On the other hand, in the case where the cured resin layer is arranged by in-line coating, preferably, the heat treatment is carried out at 70 to 280° C. for 3 to 200 seconds as a rough indication.

Irrespective of off-line coating or in-line coating, as needed, heat treatment and active energy ray radiation such as UV radiation can be combined here.

4. Use

The film with a cured resin layer of the present invention can reduce oligomer precipitation as mentioned above, and therefore can suppress visibility reduction by whitening of film appearance. Consequently, the film with a cured resin layer of the present invention has excellent low-dielectric properties without detracting from transparency.

Accordingly, the film can be favorably used for high-speed communication circuits. Use for high-speed communication circuits includes FPC (flexible printed circuits) that are flexible circuit substrates formed of a resin film and a copper foil, and transparent antennas with a nonvisible ultra-fine metal mesh wiring on a transparent film. In particular, the film can be favorably used as a substrate film for transparent antennas that are required to have high transparency.

<<Metal-Laminated Film>>

The metal-laminated film of the present invention can have a metal layer on the cured resin layer. The film can have any other layer between the cured resin layer and the metal layer.

1. Physical Properties

First described are the physical properties of the metal-laminated film of the present invention.

(1) Thickness

The thickness of the metal layer is preferably 2 to 30 μm, more preferably 3 to 25 μm. When the thickness of the metal layer is not lower than the above lower limit, electroconductivity can be sufficiently secured, and when it is not higher than the upper limit, visibility reduction in arranging the metal layer can be prevented.

The thickness of the metal layer can be measured according to a method of observing a sample cross-section with an electron microscope.

2. Components Next described are the components that constitute the metal layer.

The metal layer is a layer containing metal as the main component. The main component as referred to herein means that metal accounts for 50% by mass or more, more preferably 70% by mass or more, even more preferably 80% by mass or more, especially preferably 90% by mass or more of the metal layer.

The metal to be used includes copper, copper alloy, silver, stainless steel, nickel, nickel alloy, aluminum, aluminum alloy, titanium and titanium alloy. From the viewpoint of electromagnetic wave shielding properties, preferred are copper and silver, and from the viewpoint of flexibility, copper is more preferred.

The metal layer is, from the viewpoint of retaining the transparency that the biaxially stretched film and the film with a cured resin layer have, preferably patterned, for example, in the form of mesh or in the form of wire.

3. Use

As described above, the metal-laminated film of the present invention has excellent low-dielectric properties without detracting from transparency.

Accordingly, the film can be favorably used for high-speed communication circuits. Use for high-speed communication circuits includes FPC (flexible printed circuits) that are flexible circuit substrates formed of a resin film and a copper foil, and transparent antennas with a nonvisible ultra-fine metal mesh wiring on a transparent film. In particular, the film can be favorably used as a substrate film for transparent antennas that are required to have high transparency.

Description of Terms

In the present invention, the term "film" includes "sheet", and the term "sheet" includes "film".

In the present invention, a description "X to Y" (X and Y are arbitral numerals) includes not only a meaning of "X or more and Y or less" but also a meaning of "preferably larger than X" or "preferably smaller than Y", unless otherwise specifically indicated.

A description "X or more" (X is an arbitral numeral) includes a meaning of "preferably larger than X" unless otherwise specifically indicated; and a description "Y or less" (Y is an arbitral numeral) includes "preferably smaller than Y" unless otherwise specifically indicated.

EXAMPLES

Hereinunder Examples are shown, but the present invention is in no way restricted by these.

1. Evaluation Methods (1) Dielectric Tangent and Permittivity

The films obtained in Examples or Comparative Examples were analyzed to measure the dielectric tangent and the permittivity thereof at a frequency of 10 GHz, 28 GHz or 40 GHz according to JIS R1641, using a permittivity measurement system by AET Incorporation (cavity resonator (TE mode), control software, and a vector network analyzer MS46122B (by Anritsu Corporation)).

(2) Tensile Strength at Break

The films obtained in Examples or Comparative Examples were analyzed to measure the tensile strength at break thereof according to the method of JIS K7127:1999, using a tensile tester (tensile tester AG-1kNXplus by Shimadzu Corporation). The film was cut out in the measurement direction to give a rectangular test piece having a length of 100 mm and a width of 10 mm. Both edges in the lengthwise direction of the test piece were chucked with a distance between chucks of 40 mm, and the test piece was pulled at a pulling rate of 200 mm/min. The stress at a break point was referred to as a tensile strength at break. Each test piece was tested three times, and the resultant data thereof were averaged to give an average value of the test piece.

The tensile test was carried out in the machine direction (MD) and the transverse direction (TD) of each test piece.

(3) Viscoelasticity Measurement and Storage Elastic Modulus

The films obtained in Examples or Comparative Examples were analyzed to measure the dynamic viscoelasticity of tensile deformation thereof, according to JIS K 7244-1:1998, using a dynamic viscoelastometer (machine name: "DMS6100", by SII Nanotechnology Corporation). In the test, the film was heated from −70° C. to 300° C. at a rate of 3° C./min. Among the data of storage elastic modulus in tensile deformation at a frequency of 10 Hz, and a strain of 0.07%, the value at 23° C. was picked up as the storage elastic modulus of the tested film.

(4) Tensile Strength at Break and Strength Retention after Wet Heat Test

The films obtained in Examples or Comparative Examples each were cut into rectangular test pieces having a length of 100 mm and a width of 10 mm in the measurement direction, and tested in a wet heat test according to JIS C 60068-2-66:2001. In the wet heat test, the test piece was left in an environment of 120° C. and 85% RH for 96 hours and then left at room temperature (23° C.) for 18 hours, using a highly accelerated life test apparatus (EHS-221M) by Espec Corporation. After the wet heat test, the test piece was analyzed to measure the tensile strength at break thereof according to the method of JIS K7127:1999, using a tensile tester (tensile tester AG-1kNXplus by Shimadzu Corporation). Both edges in the lengthwise direction of the test piece were chucked with a distance between chucks of 40 mm, and the test piece was pulled at a pulling rate of 200 mm/min. The stress at a break point was referred to as a tensile strength at break. Each test piece was tested three times, and the resultant data thereof were averaged to give an average value. According to the following equation, the strength retention was calculated. The tensile test was carried in the machine direction (MD) and the transverse direction (TD) of each film.

Strength Retention=([tensile strength at break after wet heat test]/[tensile strength at break determined in (2)])×100

(5) Glass Transition Temperature

Using DSC8000 (by Perkin Elmer Japan Corporation) and according to JIS K7121 (2012), the films obtained in Examples or Comparative Examples were heated once up to the melting temperature at a heating rate of 10° C./min, and then cooled down at a cooling rate of 10° C./min, and thereafter the glass transition temperature thereof was measured in the heating process at a heating rate of 10° C./min.

(6) Crystal Melting Temperature

Using DSC8000 (by Perkin Elmer Japan Corporation) and according to JIS K7121 (2012), the films obtained in Examples or Comparative Examples were heated once up to the melting temperature at a heating rate of 10° C./min, and then cooled down at a cooling rate of 10° C./min, and thereafter the crystal melting temperature thereof was measured in the heating process at a heating rate of 10° C./min.

(7) Moldability

In producing an unstretched sheet by cooling and solidifying with a cast roll in extrusion molding, when a transparent film was produced without whitening by crystallization, it was evaluated as "good", but when a film whitened by crystallization was produced, it was evaluated as "bad".

(8) Thermal Shrinkage

The present film was cut into rectangular pieces having a length of 120 mm and a width of 10 mm in the measurement direction, and the position at a length of 100 mm from the edge was marked. The end of each test piece was clipped and hung down, and heated at 150° C. for 30 minutes. After cooled, the length from the edge to the mark of each test piece was measured to determine the thermal shrinkage thereof.

Measurement was carried out in both of the machine direction (MD) and the transverse direction (TD).

(9) Haze

Using a haze meter NDH-700011 (by Nippon Denshoku Industries Co., Ltd.) and based on JIS K7136(2000), the total light transmittance and the diffuse transmittance were measured, and the haze was calculated according to the following equation.

[Haze]=([diffuse transmittance]/[total light transmittance])×100

(10) Film Thickness

Using a 1/1000 mm dial gauge, the thickness of the present film was measured. Unspecified 5 points on the plane were measured, and the data were averaged to be the film thickness.

(11) Thickness of Cured Resin Film

The surface of the cured resin layer was stained with $RuO_4$, and buried in an epoxy resin. Subsequently, a slice prepared by an ultra-thin slicing method was stained with $RuO_4$, and the cross-section of the cured resin layer was measured with a transmission electron microscope (TEM) (H-7650 by Hitachi High-Technologies Corporation, acceleration voltage 100 kV).

(12) Oligomer (Ester Cyclic Trimer) Precipitation on the Surface of Cured Resin Layer by Heating The film with a cured resin layer obtained in Examples was cut into a sample having a size of a length of 300 mm and a width of 225 mm, and heat-treated for 120 minutes in a hot-air oven kept at a predetermined temperature (180°

C.). After the heat treatment, the sample was formed into a top-opened box having a length of 200 mm and a width of 125 mm, with the measurement surface thereof kept as an inner surface.

Next, 10 mL of DMF (dimethylformamide) was put into the box and left for 3 minutes, and thereafter DMF was collected and put into a liquid chromatography (LC-7A by Shimadzu Corporation, mobile phase A: acetonitrile, mobile phase B: aqueous 2% acetic acid solution, column: "MCI GEL ODS 1HU" by Mitsubishi Chemical Corporation, column temperature: 40° C., flow rate: 1 mL/min, detection wavelength: 254 nm), and the ester cyclic trimer amount in DMF was measured. The resultant value was divided by the film area that had been kept in contact with DMF to give the oligomer (ester cyclic trimer) amount (mg/m$^2$) of the surface of the cured resin layer. The ester cyclic trimer in DMF was determined from the peak area ratio of the standard sample peak area and the test sample peak area (absolute calibration curve method).

A previously sampled ester cyclic trimer was accurately weighed, and dissolved in DMF that had been accurately weighed to prepare the standard sample.

2. Materials

Polyester raw materials and polyester films used in Examples and Comparative Examples are as follows.

[PBN Resin (A)]

As the PBN resin (A), used was a homo PBN composed of a dicarboxylic acid component (a-1): 2,6-naphthalenedicarboxylic acid=100 mol % and a diol component (a-2): 1,4-butanediol=100 mol %. The glass transition temperature (Tg(A)) of the PBN resin was 77° C.

[PEN Resin]

As at least one kind of polyester, used was a homo PEN of a crystalline polyester (B) composed of a dicarboxylic acid component: 2,6-naphthalenedicarboxylic acid=100 mol %, and a diol component: ethylene glycol=100 mol %. The glass transition temperature (Tg) of the PEN resin was 121° C. Hereinafter the PEN resin is referred to as (B).

[Polyethylene Terephthalate Film]

As a PET film, a biaxially stretched PET film ("Diafoil T100-50" by Mitsubishi Chemical Corporation) having a thickness of 50 μm was used.

As a resin composition for forming a cured resin layer, the following was used.

[Resin Composition]
(A1): Hexamethoxymethylolmelamine
(A2): An oxazoline compound, Epocros (by Nippon Shokubai Co., Ltd.), oxazoline group amount, 7.7 mmol/g
(A3): Polyglycerol polyglycidyl ether
(B1): Silica particles having an average particle size of 0.07 μm The composition of the coating liquid used in Examples is shown in Table 1. More specifically, a resin composition obtained by stirring and mixing the components shown in Table 1 below was diluted with water to prepare a coating liquid.

TABLE 1

| | Resin Composition (content ratio (% by mass) relative to total nonvolatile component)) | | | |
|---|---|---|---|---|
| | (A1) | (A2) | (A3) | (B1) |
| Coating Liquid | 55 | 30 | 10 | 5 |

Example 1

Pellets (B) were added in a proportion of 90% by mass to 10% by mass of pellets (A) ((A) was 100 parts by mass, and (B) was 900 parts by mass), dry-blended, then melt-kneaded with a (D 40 mm twin-screw extruder set at 285° C., and extruded out as a film through the T-die having a gap of 1.0 mm, taken up with a cast roll at 105° C., cooled and solidified to give a filmy product (cast film) having a thickness of about 450 μm.

Subsequently, the resultant cast film was led to pass through a longitudinal stretching machine, heated with an IR heater (temperature around heater: 170° C.) and stretched by 2.8 times in the machine direction (MD). Subsequently, the resultant longitudinally stretched film was led to pass through a lateral stretching machine (tenter), and stretched by 4.0 times in the transverse direction (TD) at a preheating temperature of 130° C., a stretching temperature of 135° C. and a thermal fixation temperature of 190° C., and thereafter while thermally fixed in the tenter, the film was relaxed by 5% in the transverse direction (TD).

The results of measurement of the resultant film are shown in Table 2.

Example 2

A cast film was produced in the same manner as in Example 1, except that the pellets (B) were added in a proportion of 80% by mass to 20% by mass of the pellets (A) ((A) was 100 parts by mass, and (B) was 400 parts by mass) and dry-blended, and thereafter the cast roll temperature was changed to 100° C.

Subsequently, the resultant cast film was led to pass through a longitudinal stretching machine, heated with an IR heater (temperature around heater: 160° C.) and stretched by 2.8 times in the machine direction (MD). Subsequently, the resultant longitudinally stretched film was led to pass through a lateral stretching machine (tenter), and stretched by 3.9 times in the transverse direction (TD) at a preheating temperature of 120° C., a stretching temperature of 125° C. and a thermal fixation temperature of 190° C., and then relaxed by 5% in the tenter.

The results of measurement of the resultant film are shown in Table 2.

Example 3

A cast film was produced in the same manner as in Example 1, except that the pellets (B) were added in a proportion of 70% by mass to 30% by mass of the pellets (A) ((A) was 100 parts by mass, and (B) was 233 parts by mass) and dry-blended, and thereafter the cast roll temperature was changed to 95° C.

Subsequently, the resultant cast film was led to pass through a longitudinal stretching machine, heated with an IR heater (temperature around heater: 155° C.) and stretched by 2.8 times in the machine direction (MD). Subsequently, the resultant longitudinally stretched film was led to pass through a lateral stretching machine (tenter), and stretched by 3.9 times in the transverse direction (TD) at a preheating temperature of 115° C., a stretching temperature of 120° C. and a thermal fixation temperature of 190° C., and then relaxed by 5% in the tenter.

The results of measurement of the resultant film are shown in Table 2.

Example 4

A cast film was produced in the same manner as in Example 1, except that the pellets (B) were added in a proportion of 60% by mass to 40% by mass of the pellets (A) ((A) was 100 parts by mass, and (B) was 150 parts by mass) and dry-blended, and thereafter the cast roll temperature was changed to 90° C.

Subsequently, the resultant cast film was led to pass through a longitudinal stretching machine, heated with an IR heater (temperature around heater: 145° C.) and stretched by 2.8 times in the machine direction (MD). Subsequently, the resultant longitudinally stretched film was led to pass through a lateral stretching machine (tenter), and stretched by 3.8 times in the transverse direction (TD) at a preheating temperature of 105° C., a stretching temperature of 110° C. and a thermal fixation temperature of 190° C., and then relaxed by 5% in the tenter.

The results of measurement of the resultant film are shown in Table 2.

Example 5

A cast film was produced in the same manner as in Example 1, except that the pellets (B) were added in a proportion of 50% by mass to 50% by mass of the pellets (A) ((A) was 100 parts by mass, and (B) was 100 parts by mass) and dry-blended, and thereafter the cast roll temperature was changed to 81° C.

Subsequently, the resultant cast film was led to pass through a longitudinal stretching machine, heated with an IR heater (temperature around heater: 135° C.) and stretched by 2.8 times in the machine direction (MD). Subsequently, the resultant longitudinally stretched film was led to pass through a lateral stretching machine (tenter), and stretched by 4.0 times in the transverse direction (TD) at a preheating temperature of 95° C., a stretching temperature of 100° C. and a thermal fixation temperature of 190° C., and then relaxed by 5% in the tenter.

The results of measurement of the resultant film are shown in Table 2.

Example 6

A cast film was produced in the same manner as in Example 1, except that the pellets (B) were added in a proportion of 40% by mass to 60% by mass of the pellets (A) ((A) was 100 parts by mass, and (B) was 67 parts by mass) and dry-blended, and thereafter the cast roll temperature was changed to 70° C.

Subsequently, the resultant cast film was led to pass through a longitudinal stretching machine, heated with an IR heater (temperature around heater: 133° C.) and stretched by 2.8 times in the machine direction (MD). Subsequently, the resultant longitudinally stretched film was led to pass through a lateral stretching machine (tenter), and stretched by 3.7 times in the transverse direction (TD) at a preheating temperature of 95° C., a stretching temperature of 100° C. and a thermal fixation temperature of 190° C., and then relaxed by 5% in the tenter.

The results of measurement of the resultant film are shown in Table 2.

Example 7

In Example 6, after stretching in the machine direction (MD) but before stretching in the transverse direction (TD), the above-mentioned coating liquid was applied to both surfaces of the monoaxially stretched film to give a biaxially stretched film having a cured resin layer with a thickness (after dried) of 0.04 μm (film with cured resin layer).

In Example 7, the film was stretched by 3.0 times in the machine direction (MD) at 100° C. Further in a tenter, the film was preheated at 100° C., and then stretched by 4.5 times in the transverse direction (TD) at 110° C. Finally, by heat treatment at 200° C., the biaxially stretched film was formed so as to have a thickness of 125 μm.

The results of measurement of the resultant film with the cured resin layer are shown in Table 2.

In addition, Table 3 below shows the evaluation result of the oligomer precipitation amount on the surface of the cured resin layer by heating the resultant film with the cured resin layer.

Comparative Example 1

A cast film was attempted to be produced in the same method as in Example 1 except that 100% by mass of the pellets (A) were used and the cast roll temperature was 75° C., but whitening, which seemed to be crystallization, occurred, and owing to adhesion failure to the cast roll, a film having a poor appearance and an uneven thickness was produced, that is, a stretchable amorphous film could not be obtained. Accordingly, in Table 2, the moldability is "bad".

Comparative Example 2

A cast film was produced in the same method as in Example 1 except that 100% by mass of the pellets (B) were used and the cast roll temperature was 110° C.

Subsequently, the resultant cast film was led to pass through a longitudinal stretching machine, heated with an IR heater (temperature around heater: 175° C.) and stretched by 2.6 times in the machine direction (MD). Subsequently, the resultant longitudinally stretched film was led to pass through a lateral stretching machine (tenter), and stretched by 3.8 times in the transverse direction (TD) at a preheating temperature of 125° C., a stretching temperature of 130° C. and a thermal fixation temperature of 190° C., and thereafter the film was relaxed by 5% in the tenter.

The results of measurement of the resultant film are shown in Table 2.

Comparative Example 3

The results of measurement of a biaxially stretched PET film are shown in Table 2.

TABLE 2

|  |  |  | Example 1 | Example 2 | Example 3 | Example 4 | Example 5 | Example 6 |
|---|---|---|---|---|---|---|---|---|
| PBN Resin (A) |  | mass % | 10 | 20 | 30 | 40 | 50 | 60 |
| PEN Resin |  | mass % | 90 | 80 | 70 | 60 | 50 | 40 |
| PET Film |  | mass % | — | — | — | — | — | — |
| Moldability |  |  | good | good | good | good | good | good |
| Draw Ratio | MD | times | 2.8 | 2.8 | 2.8 | 2.8 | 2.8 | 2.8 |
|  | TD | times | 4.0 | 3.9 | 3.9 | 3.8 | 4.0 | 3.7 |

TABLE 2-continued

| | | | | | | | |
|---|---|---|---|---|---|---|---|
| Thickness | μm | 50 | 50 | 50 | 50 | 50 | 50 |
| Glass Transition Temperature | °C. | 113 | 108 | 104 | 100 | 97 | 94 |
| Crystal Melting Temperature | °C. | 261 | 260 | 259 | 235, 257 | 236, 256 | 237, 254 |
| Dielectric Tangent (28 GHz) | — | 0.0038 | 0.0036 | 0.0034 | 0.0033 | 0.0032 | 0.0032 |
| Permittivity (28 GHz) | — | 3.16 | 3.21 | 3.21 | 3.17 | 3.15 | |
| Tensile Strength at MD | MPa | 180 | 211 | 175 | 208 | 186 | 171 |
| Break TD | | 255 | 242 | 276 | 269 | 199 | 209 |
| Storage Elastic Modulus MD | GPa | 4.9 | 4.6 | 4.3 | 3.8 | 4.7 | 3.8 |
| TD | | 6.0 | 7.1 | 6.6 | 6.7 | 4.6 | 5.7 |
| Tensile Strength at MD | MPa | 152 | 148 | 136 | 138 | 140 | 133 |
| Break after wet heat test TD | | 201 | 192 | 209 | 187 | 145 | 167 |
| Storage Elastic Modulus MD | % | 84 | 70 | 78 | 66 | 75 | 78 |
| after wet heat test TD | | 79 | 79 | 76 | 70 | 73 | 80 |
| Thermal Shrinkage MD | % | 1.2 | 1.7 | 1.9 | 1.7 | 1.7 | 1.9 |
| TD | | 1.2 | 1.3 | 1.7 | 2.5 | 0.9 | 1.1 |
| Haze | % | 0.3 | 0.2 | 0.2 | 0.2 | 0.3 | 0.5 |

| | | Example 7 | Comparative Example 1 | Comparative Example 2 | Comparative Example 3 |
|---|---|---|---|---|---|
| PBN Resin (A) | mass % | 60 | 100 | — | — |
| PEN Resin | mass % | 40 | — | 100 | — |
| PET Film | mass % | — | — | — | 100 |
| Moldability | | good | bad | good | good |
| Draw Ratio MD | times | 3.0 | — | 2.6 | — |
| TD | times | 4.5 | — | 3.8 | — |
| Thickness | μm | 125 | — | 50 | 50 |
| Glass Transition Temperature | °C. | 93 | — | 121 | 78 |
| Crystal Melting Temperature | °C. | 235, 252 | — | 263 | 256 |
| Dielectric Tangent (28 GHz) | — | 0.0027 | — | 0.0041 | 0.0057 |
| Permittivity (28 GHz) | — | 3.20 | — | 3.14 | 3.15 |
| Tensile Strength at MD | MPa | 162 | — | 167 | 183 |
| Break TD | | 154 | — | 310 | 243 |
| Storage Elastic Modulus MD | GPa | 4.8 | — | 5.5 | 4.2 |
| TD | | 4.4 | — | 8.2 | 5.2 |
| Tensile Strength at MD | MPa | 130 | — | 156 | 28 |
| Break after wet heat test TD | | 108 | — | 222 | 32 |
| Storage Elastic Modulus MD | % | 80 | — | 93 | 15 |
| after wet heat test TD | | 70 | — | 72 | 13 |
| Thermal Shrinkage MD | % | 1.2 | — | 0.9 | 0.4 |
| TD | | 0.3 | — | 1.0 | 0.2 |
| Haze | % | 0.9 | — | 0.3 | 4.3 |

TABLE 3

| | Example 7 |
|---|---|
| Oligomer Precipitation Amount (mg/m²) on the surface of cured resin layer | 0.17/0.17 |

0.17/0.17 in Table 3 means that the oligomer precipitation amount on one surface is 0.17 mg/m², and the oligomer precipitation amount on the other surface is 0.17 mg/m².

Further, the following Table 4 shows the dielectric tangent and the permittivity at 10 GHz and 40 GHz of the films of Examples 1 to 7 and Comparative Examples 2 and 3.

TABLE 4

| | | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|---|
| 10 GHz | Dielectric Tangent | 0.0034 | 0.0033 | 0.0031 | 0.0030 | 0.0029 | 0.0029 | 0.0024 | — | 0.0037 | 0.0050 |
| | Permittivity | 3.20 | 3.22 | 3.23 | 3.23 | 3.18 | 3.11 | 3.23 | — | 3.14 | 3.17 |
| 40 GHz | Dielectric Tangent | 0.0040 | 0.0038 | 0.0035 | 0.0034 | 0.0034 | 0.0033 | 0.0028 | — | 0.0042 | 0.0059 |
| | Permittivity | 3.19 | 3.20 | 3.20 | 3.20 | 3.16 | 3.13 | 3.18 | — | 3.15 | 3.14 |

As obvious from the above Examples 1 to 6, the biaxially stretched film of the present invention has low-dielectric properties in a high-frequency range, and therefore has a small transmission loss and is applicable to 5G high-speed large-capacity data communication. In addition, having a large tensile strength at break, the film has sufficient mechanical properties. Further, having a large storage elastic modulus, the film has a high stiffness and good handleability. In addition, the film has a high tensile strength at break and good strength retention after wet heat test, and can be said to be excellent in hydrolysis resistance and have sufficient weather resistance. Moreover, the film has a small thermal shrinkage and is excellent in heat resistance, and further the film has a small haze and is excellent in transparency.

In addition to these properties, since the film is a versatile polyester film, it is advantageous in terms of cost and is easy to produce.

From the results in Example 7, the film with a cured resin layer of the present invention has a cured resin layer on at least one surface layer of a biaxially stretched film, and therefore can reduce the oligomer precipitation amount on the surface of the cured resin layer.

Accordingly, the film with a cured resin layer of the present invention has good visibility and can be favorably used for a substrate film for transparent antennas that are required to have especially high transparency.

INDUSTRIAL APPLICABILITY

The biaxially stretched film, the film with a cured resin layer and the metal laminated film of the present invention have excellent low-dielectric properties, and are therefore favorably used for high-speed communication circuits, especially for FPC (flexible printed circuits) that are flexible circuit substrates formed of a resin film and a copper foil, and transparent antennas with a nonvisible ultra-fine metal mesh wiring on a transparent film.

Above all, in the case where the biaxially stretched film, the film with a cured resin layer and the metal laminated film of the present invention have high transparency, these can be favorable used as a substrate film of the above-mentioned transparent antennas.

In particular, in the case where the biaxially stretched film, the film with a cured resin layer and the metal laminated film of the present invention are excellent in the balance of low-dielectric properties, mechanical properties and weather resistance, these can be favorably used for outdoor application among the above-mentioned applications.

The invention claimed is:

1. A biaxially stretched film comprising a polybutylene naphthalate resin (A) and a polyethylene naphthalate resin (B),
wherein a dielectric tangent at 28 GHz of the biaxially stretched film is 0.0040 or less, and
the biaxially stretched film comprises the polybutylene naphthalate resin (A) in an amount of 45% by mass or more and 70% by mass or less.

2. The biaxially stretched film according to claim 1, wherein a relative permittivity at 28 GHz of the biaxially stretched film is 3.15 or more and 3.25 or less.

3. The biaxially stretched film according to claim 1, wherein a tensile strength at break in both a machine direction (MD) and a transverse direction (TD) of the biaxially stretched film is 150 MPa or more.

4. The biaxially stretched film according to claim 1, wherein a storage elastic modulus in dynamic viscoelastic measurement at 23° C. in both the machine direction (MD) and the transverse direction (TD) of the biaxially stretched film is 3.5 GPa or more.

5. The biaxially stretched film according to claim 1, wherein a tensile strength at break in both a machine direction (MD) and a transverse direction (TD) when the biaxially stretched film is allowed to stand for 96 hours in an environment of 120° C. and 85% RH and then is allowed to stand at room temperature (23° C.) for 18 hours is 100 MPa or more.

6. The biaxially stretched film according to claim 1, wherein a strength retention in both a machine direction (MD) and a transverse direction (TD) when the biaxially stretched film is allowed to stand for 96 hours in an environment of 120° C. and 85% RH and then is allowed to stand at room temperature (23° C.) for 18 hours is 50% or more.

7. The biaxially stretched film according to claim 1, comprising the polybutylene naphthalate resin (A) in an amount of 50% by mass or more and 70% by mass or less.

8. The biaxially stretched film according to claim 1, wherein the polyethylene naphthalate resin (B) is a crystalline polyethylene naphthalate resin.

9. The biaxially stretched film according to claim 8, wherein a glass transition temperature of the crystalline polyethylene naphthalate resin (B) is higher than a glass transition temperature of the polybutylene naphthalate resin (A).

10. The biaxially stretched film according to claim 8, wherein in the crystalline polyethylene naphthalate resin, an acid component having a benzene skeleton as a copolymerization component other than 2,6-naphthalenedicarboxylic acid in a total dicarboxylic acid component is 5 mol % or less.

11. The biaxially stretched film according to claim 1, wherein a thickness of the biaxially stretched film is 40 to 150 μm.

12. A film comprising: a biaxially stretched film; and a cured resin layer disposed on at least one surface of the biaxially stretched film,
wherein the biaxially stretched film comprises: 5% by mass or more and 70% by mass or less of a polybutylene naphthalate resin (A); and a polyethylene naphthalate resin (B),
a dielectric tangent at 28 GHz of the biaxially stretched film is 0.0040 or less,
the cured resin layer comprises a resin composition containing a crosslinking agent in an amount of 70% by mass or more relative to a nonvolatile component in the resin composition.

13. A metal laminated film comprising a metal layer and the film according to claim 12, wherein the metal layer is disposed on the cured resin layer.

14. The metal laminated film according to claim 13, wherein the metal layer is patterned.

15. The metal laminated film according to claim 13, wherein the metal layer comprises copper or silver.

16. A high-speed communication circuit comprising the biaxially stretched film according to claim 1.

17. The high-speed communication circuit according to claim 16, wherein a substrate film for a transparent antenna comprises the biaxially stretched film.

18. The high-speed communication circuit according to claim 16, further comprising a cured resin layer disposed on at least one surface of the biaxially stretched film.

19. The biaxially stretched film according to claim 2, wherein a tensile strength at break in both a machine direction (MD) and a transverse direction (TD) of the biaxially stretched film is 150 MPa or more.

* * * * *